United States Patent
Yildirim et al.

(10) Patent No.: US 9,716,522 B2
(45) Date of Patent: Jul. 25, 2017

(54) RADIO COMMUNICATION MODULE

(71) Applicant: Bosch Corporation, Tokyo (JP)

(72) Inventors: Fevzi Yildirim, Kanagawa (JP); Yasuaki Kurita, Kanagawa (JP); Wilko-Gordon Block, Kanagawa (JP); Hiroshi Toida, Kanagawa (JP)

(73) Assignee: Bosch Corporation, Tokyo (JP)

( * ) Notice: Subject to any disclaimer, the term of this patent is extended or adjusted under 35 U.S.C. 154(b) by 0 days.

(21) Appl. No.: 14/893,153

(22) PCT Filed: Mar. 21, 2014

(86) PCT No.: PCT/JP2014/057926
§ 371 (c)(1),
(2) Date: Nov. 23, 2015

(87) PCT Pub. No.: WO2014/188771
PCT Pub. Date: Nov. 27, 2014

(65) Prior Publication Data
US 2016/0094261 A1 Mar. 31, 2016

(30) Foreign Application Priority Data
May 21, 2013 (JP) .................. 2013-106886

(51) Int. Cl.
*H04B 1/38* (2015.01)
*H04B 1/3822* (2015.01)
(Continued)

(52) U.S. Cl.
CPC ......... *H04B 1/3822* (2013.01); *H01Q 1/2291* (2013.01); *H01Q 1/3291* (2013.01);
(Continued)

(58) Field of Classification Search
None
See application file for complete search history.

(56) References Cited

U.S. PATENT DOCUMENTS

2001/0050647 A1  12/2001 Kanayama et al.
2002/0119801 A1*  8/2002 Nemoto ............... H01Q 1/244
455/575.3

(Continued)

FOREIGN PATENT DOCUMENTS

CN  202395155 U  8/2012
EP  1342633 A2  9/2003
(Continued)

OTHER PUBLICATIONS

International Search Report for Application No. PCT/JP2014/057926 dated Jun. 17, 2014 (English Translation, 1 page).

*Primary Examiner* — Mohammed Rachedine
(74) *Attorney, Agent, or Firm* — Michael Best & Friedrich LLP

(57) ABSTRACT

To reduce the size of a radio communication module installed in a vehicle by simplifying the structure thereof. A radio communication module 100 includes a board 170 on which electronic components 172 for radio communication are mounted and a housing 110 accommodating the board 170 and is installed in the vehicle. The board 170 has a hole 180 into which a pin 150 standing in the housing 110 is inserted to fix the board 170 in the housing 110 by inserting the pin 150 to the hole 180. The pin 150 functions as an antenna for transmitting and receiving a signal in the radio communication.

13 Claims, 8 Drawing Sheets

202 CAN INTERFACE
100 RADIO COMMUNICATION MODULE
102 Bluetooth INTERFACE
300 ENGINE ECU

(51) Int. Cl.
*H01Q 1/44* (2006.01)
*H01Q 1/22* (2006.01)
*H01Q 1/32* (2006.01)
*H04B 1/3888* (2015.01)
*H05K 5/00* (2006.01)
*H04B 1/40* (2015.01)

(52) U.S. Cl.
CPC ............. *H01Q 1/44* (2013.01); *H04B 1/3888* (2013.01); *H04B 1/40* (2013.01); *H05K 5/006* (2013.01)

(56) References Cited

U.S. PATENT DOCUMENTS

2009/0005110 A1    1/2009   Ozden
2014/0011465 A1*   1/2014   Snider ................... H01Q 1/088
                                                                455/90.2

FOREIGN PATENT DOCUMENTS

| JP | S5912802 A | 4/1984 |
| JP | 10199939 | 7/1998 |
| JP | H10208798 A | 8/1998 |
| JP | 2003179515 | 6/2003 |
| JP | 2003298328 A | 10/2003 |
| JP | 2005328112 | 11/2005 |
| JP | 2005328112 A | 11/2005 |
| JP | 2008213512 | 9/2008 |
| JP | 2011238495 A | 11/2011 |

* cited by examiner

202 CAN INTERFACE

100 RADIO COMMUNICATION MODULE

102 Bluetooth INTERFACE

300 ENGINE ECU

RADIO COMMUNICATION MODULE

BACKGROUND OF THE INVENTION

The present invention relates to a radio communication module.

Recently, an anti-lock braking system (ABS) has been adopted to control the brake of a vehicle.

An ABS monitors the speed and the like of a vehicle and, when detecting a state in which wheels may be locked based on the monitored values, reduces the brake hydraulic pressure by closing the inlet valve of a brake hydraulic circuit and opening the outlet valve. In addition, after recovery from a state in which wheels may be locked by reducing the brake hydraulic pressure, an ABS increases the brake hydraulic pressure by closing the outlet valve and opening the inlet valve. An ABS achieves the same effect as a pumping brake by increasing or reducing the brake hydraulic pressure in this way and suppresses the occurrence of a skid caused by locked wheels.

As for an ABS, in the related art, a switch for putting the ABS in a stop mode is provided in the meter unit of a vehicle and a switching operation of the ABS is performed in the meter unit.

SUMMARY OF THE INVENTION

However, since a changeover switch for an ABS is provided in the meter unit of a vehicle in the related art, the space for installing the changeover switch needs to be provided in the meter unit. In addition, wiring for interconnecting the changeover switch and the ABS ECU (electronic control unit) is also necessary. Similarly, such problems also arise not only in switching of an ABS, but also, for example, in switching in the engine mode (switching between a SPORT mode, a NORMAL mode, an ECO mode, and the like) or on-off switching of ESC (electronic stability control).

As a measure against such problems, there is an idea of eliminating the installation space for a changeover switch and the connection wiring by using an external device such as a smartphone using radio communication such as, for example, Bluetooth (registered trademark) to perform various types of switching operations on the vehicle.

In this case, a radio communication module is installed in the vehicle to transmit and receive signals between an external device and the ECU of the vehicle. The radio communication module needs to perform good communication between an external device and the ECU of the vehicle and to meet various types of regulations about radio communication. One important factor for meeting these requirements is an antenna for transmitting and receiving radio signals. For example, since the radio communication module has a board on which electronic components for radio communication are mounted, a pattern antenna may be provided on the board.

However, if a pattern antenna is provided on the board, the size of the board increases, thereby enlarging the radio communication module. Alternatively, if a chip antenna is mounted instead of a pattern antenna on the board to make the size of the board smaller than in a pattern antenna, the structure may become complicated because the number of components increases, possibly leading to an increase in the cost.

An object of the invention of the present application is to reducing the size of a radio communication module installed in a vehicle by simplifying the structure thereof.

The invention of the present application addresses the above problems with an object of providing a radio communication module according to an embodiment includes a board on which electronic components for radio communication are mounted and a housing accommodating the board and is installed in a vehicle. The board has a hole into which a pin standing in the housing is inserted to fix the board in the housing and the pin functions as an antenna for transmitting and receiving a signal in the radio communication.

In addition, the pin functioning as the antenna may include an embedded section embedded in a molded portion of the housing and a projecting section projecting from the molded portion and the embedded section may include an extending section extending in a direction in which the pin is embedded and a pair of overhanging sections overhanging from the extending section in a direction intersecting the direction in which the pin is embedded.

In addition, the projecting section may be press-fit-machined.

In addition, the radio communication module may be installed in the vehicle so that the projecting section of the pin functioning as the antenna is disposed close to the vehicle and the embedded section of the pin functioning as the antenna is disposed away from the vehicle.

In addition, the board may has a plurality of holes into which a plurality of pins standing in the housing may be inserted to fix the board in the housing and at least one of the plurality of pins may function as an antenna for transmitting and receiving a signal in the radio communication.

According to the invention of the present application, the size of a radio communication module installed in a vehicle can be reduced by simplifying the structure thereof.

DETAILED DESCRIPTION

Figure 1:
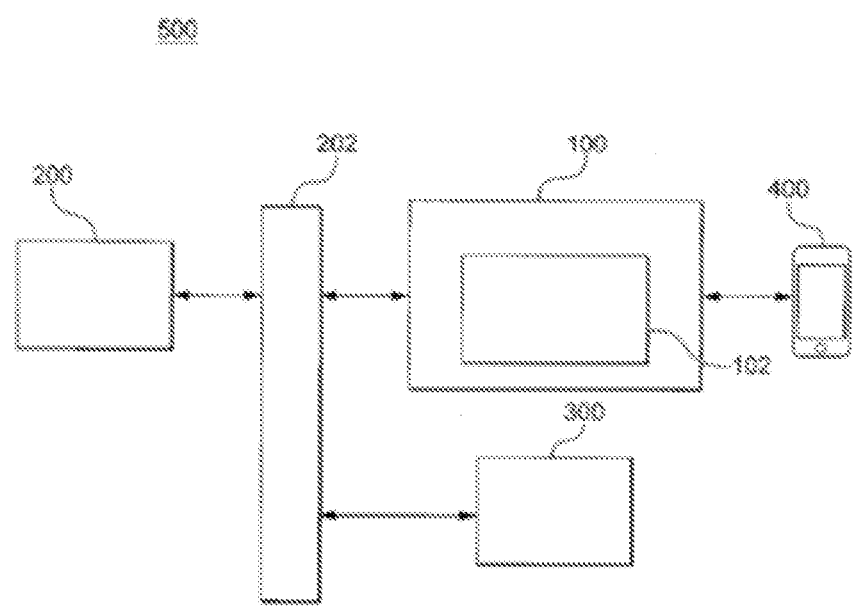
FIG. 1 shows the entire structure of a vehicle control system including a radio communication module according to the present embodiment.

A radio communication module according to an embodiment of the invention of the present application will be described below with reference to the drawings. FIG. 1 shows the entire structure of a vehicle control system including the radio communication module according to the embodiment.

As shown in FIG. 1, a vehicle control system 500 according to the embodiment includes a radio communication module 100 that performs radio communication with an electronic device 400 such as a smartphone. The radio communication module 100 includes a Bluetooth (registered trademark) interface 102 that performs radio communication with the electronic device 400. Although the present embodiment shows an example of performing radio communication with the electronic device 400 using Bluetooth (registered trademark), the invention is not limited to the embodiment.

In addition, the vehicle control system 500 according to the embodiment includes an ABSECU (Antilock Brake System Electronic Control Unit) 200 connected to the radio communication module 100 via a CAN (Controller Area Network) interface 202.

The ABSECU 200 is an electronic control apparatus for suppressing the locking of wheels and, when detecting a state in which wheels may be locked based on the values obtained by monitoring specifically the speed or the like of a vehicle, reduces the brake hydraulic pressure by closing the inlet valve of a brake hydraulic circuit and opening the outlet valve. In addition, after recovery from a state in which wheels may be locked by reducing the brake hydraulic pressure, the ABSECU 200 increases the brake hydraulic pressure by closing the outlet valve and opening the inlet valve. The ABSECU 200 achieves the same effect as a pumping brake by increasing or reducing the brake hydraulic pressure in this way and suppresses the occurrence of a skid caused by locked wheels.

In addition, the vehicle control system 500 according to the embodiment includes an engine ECU 300 connected to the radio communication module 100 via the CAN interface 202. The engine ECU 300 is an electronic control apparatus for controlling various types of parameters of the engine of a vehicle. Specifically, the engine ECU 300 controls an engine by calculating the optimum amount of fuel injection, the optimum injection time, the optimum ignition time, the optimum idle engine speed, and the like depending on the state of the engine.

The radio communication module 100 receives a user's operation instruction signal transmitted wirelessly from the electronic device 400 via the Bluetooth (registered trademark) protocol. The radio communication module 100 outputs the operation instruction signal to another ECU installed in the ABSECU 200, the engine ECU 300, or the vehicle based on the received operation instruction signal. The other ECU installed in the ABSECU 200, the engine ECU 300, or the vehicle controls components of the vehicle based on the operation instruction signal output from the radio communication module 100.

According to the embodiment, switching operation of an ABS mode, engine mode, or the like can be performed without providing a changeover switch or the like for an ABS mode, engine mode, or the like on the dashboard or the like of a vehicle.

That is, generally, the drive mode may be switched among the SPORT mode for emphasizing the torque feeling of an engine, the ECO mode for eco driving, the NORMAL mode for striking a balance between these modes, and so on. Similarly, on-off switching of ESC (Electronic Stability Control) may be performed by a changeover switch provided on the dashboard or the like of a vehicle. In addition, the timing, the amount, and the like of increase or reduction of the brake hydraulic pressure in an ABS may be switched by a changeover switch provided on the dashboard or the like of a vehicle.

In contrast, according to the embodiment, the switching operation of the ABS mode, the engine mode, or the like can be performed via the electronic device 400, so there is no need to provide a changeover switch on the dashboard or the like. In addition, the embodiment also eliminates the wiring interconnecting the changeover switch and ECUs.

In addition, when a changeover switch is provided on a dashboard or the like, there are certain restrictions on the number of switching positions: for example, three positions (the SPORT mode, the ECO mode, and the NORMAL mode) in the case of switching of the engine mode or two positions (ON and OFF) in the case of switching of ESC. In contrast, according to the embodiment, since the switching operation of the ABS mode, the engine mode, or the like is performed via the electronic device 400, it is possible to perform switching of the ABS mode, the engine mode, or the like among more positions using an input interface such as a panel of the electronic device 400.

In addition, according to the embodiment, there is no need to provide a changeover switch on a dashboard or the like, space saving can be achieved on a dashboard or the like. Although such space saving is important for four-wheel vehicles, it has more remarkable effects on two-wheel vehicles that have particularly less space for a changeover switch and the like.

Figure 2:
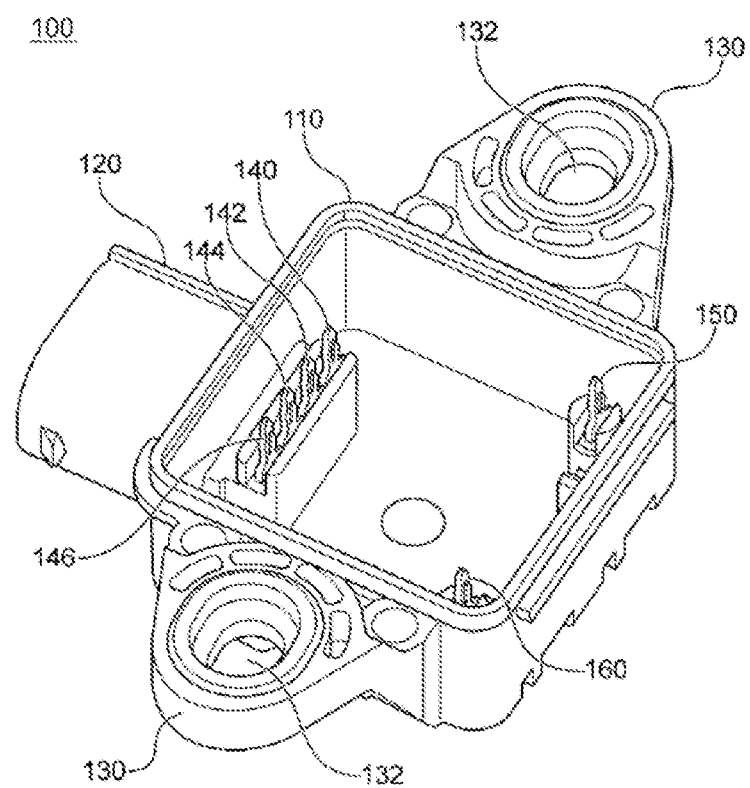
FIG. 2 is a perspective view showing a housing of the radio communication module according to the embodiment.
Figure 3:
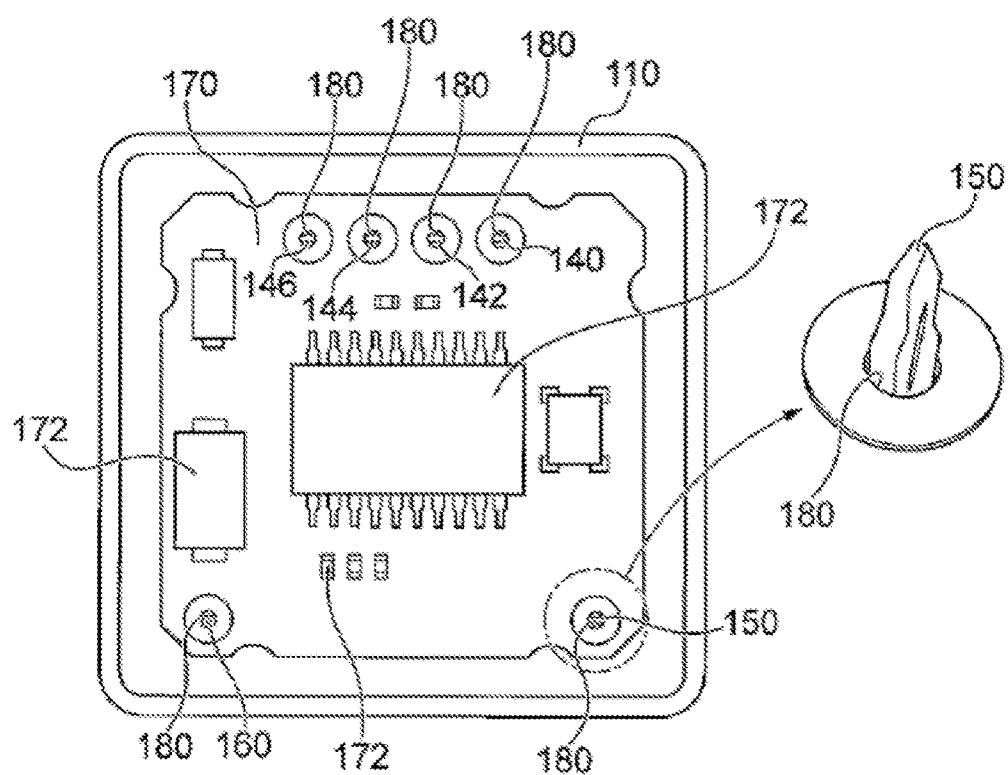
FIG. 3 is a plan view showing the housing and a board of the radio communication module according to the embodiment.

Next, the radio communication module 100 will be described in detail. FIG. 2 is a perspective view showing the housing of the radio communication module according to the embodiment. FIG. 3 is a plan view showing the housing and the board of the radio communication module according to the embodiment.

As shown in FIGS. 2 and 3, the radio communication module 100 includes a board 170 on which various types of electronic components 172 are mounted and a rectangular parallelepiped box housing 110 accommodating the board 170.

In the housing 110, a plurality of pins 140, 142, 144, 146, 150, and 160 stand on the bottom of the housing 110. In the board 170, there are a plurality of holes 180 into which the plurality of pins 140, 142, 144, 146, 150, and 160 are inserted so as to correspond to the positions of the plurality of pins 140, 142, 144, 146, 150, and 160. The board 170 is fixed within the housing 110 by inserting the plurality of pins 140, 142, 144, 146, 150, and 160 into the holes 180. Although the embodiment shows an example in which the plurality of holes 180 corresponding to the plurality of pins 140, 142, 144, 146, 150, and 160 are formed, the invention is not limited to the embodiment and one hole into which one pin is inserted may be formed.

On each of two surfaces of the housing 110 that face each other, a fixation portion 130 for attaching the radio communication module 100 to the vehicle is provided so as to project outward from the housing 110. The fixation portion 130 has a hole 132 through which a bolt for attaching the radio communication module 100 to the vehicle passes.

One surface of the housing 110 on which the fixation portion 130 is not provided, a connector 120 for connecting the board 170 and the ECUs installed in the vehicle is provided so as to project outward from the housing 110.

In the radio communication module 100, the pins 140, 142, 144, and 146 have a function of fixing the board 170 to the housing 110 and a function of electrically connecting the power source, GND, and electric signals for communication via the connector 120 between ECUs installed in the vehicle and the board 170.

In addition, the pin 150 fixes the board 170 to the housing 110 and functions as an antenna for transmitting and receiving a signal for radio communication with the electronic device 400. Although the embodiment shows an example in which the pin 150 functions as an antenna, the invention is not limited to the embodiment and at least one of the plurality of pins only needs to function as an antenna. The pin 150 and the like will be described in detail below.

Figure 4:
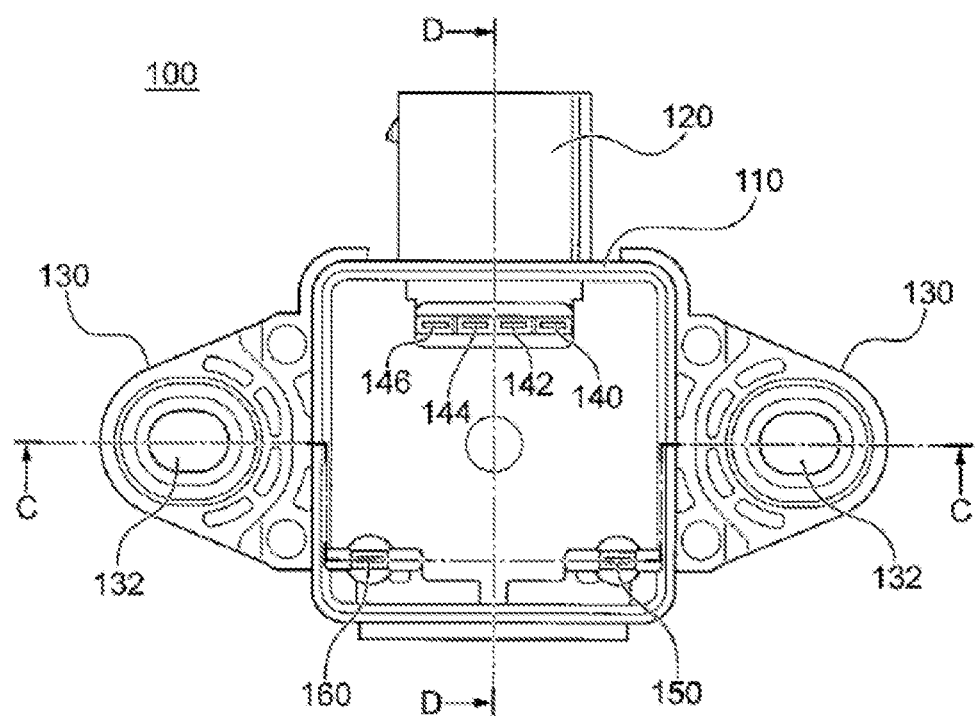
FIG. 4 is a plan view showing the housing of the radio communication module according to the embodiment.
Figure 5:
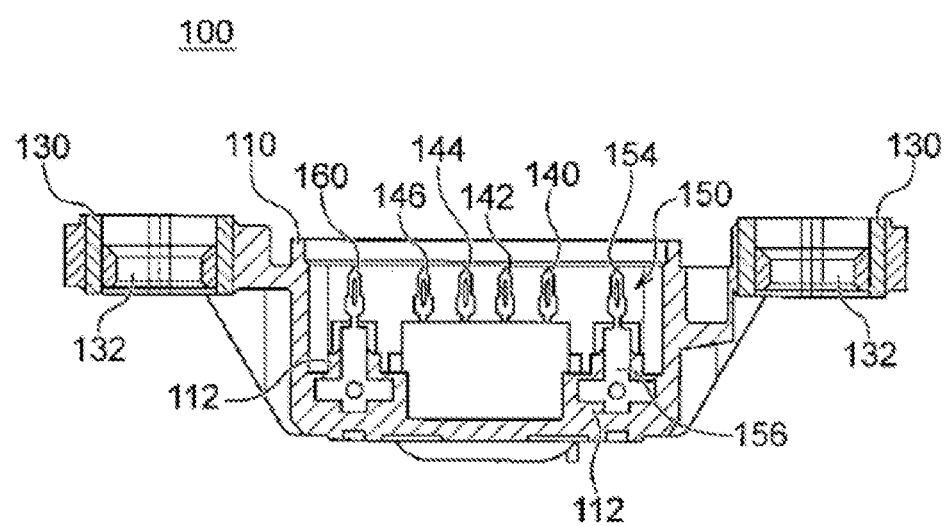
FIG. 5 is a cross sectional view showing a cross section C-C of the housing of the radio communication module in FIG. 4.
Figure 6:
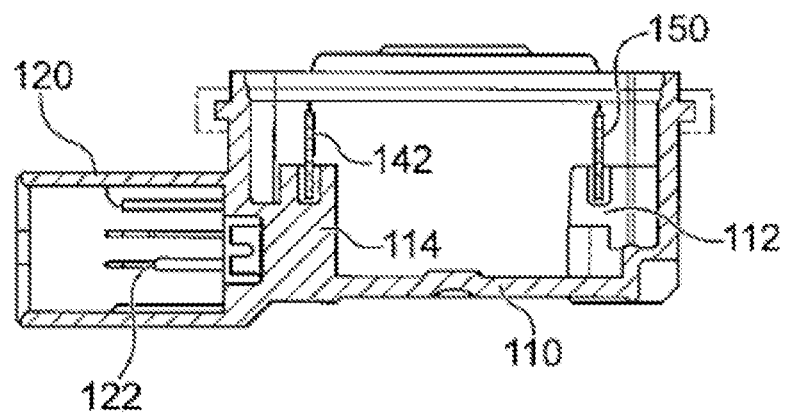
FIG. 6 is a cross sectional view showing a cross section D-D of the housing of the radio communication module in FIG. 4.
Figure 7:
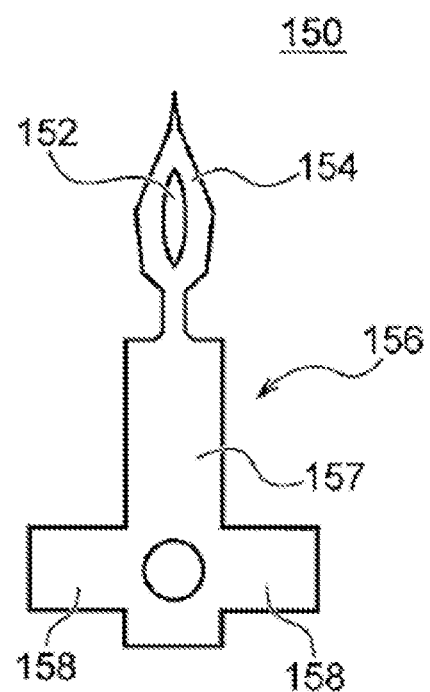
FIG. 7 shows the structure of a pin.
Figure 8:
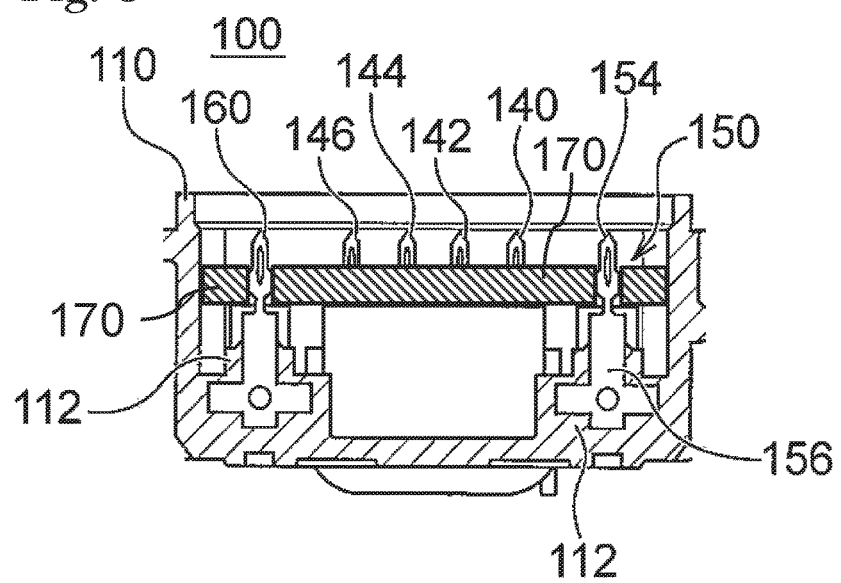
FIG. 8 is a close-up view of a section of FIG. 5 with the board 170 positioned in the housing 110.

FIG. 4 is a plan view showing the housing of the radio communication module according to the embodiment. FIG. 5 is a cross sectional view showing a cross section C-C of the housing of the radio communication module in FIG. 4. FIG. 6 is a cross sectional view showing a cross section D-D of the housing of the radio communication module in FIG. 4. FIG. 7 shows the structure of a pin.

As shown in FIG. 6, a plurality of terminals 122 are provided in the connector 120. The plurality of terminals 122 are electrically connected to the pins 140, 142, 144, and 146 in a molded portion 114 of the housing 110. When the connector 120 is connected to a vehicle side connector, the plurality of terminals 122 are electrically connected to a plurality of terminals of the vehicle side connector. As a result, the power source, GND, and signals for communication are electrically connected between the ECUs installed in the vehicle and the board 170.

In addition, as shown in FIGS. 5 and 7, the pin 150 functioning as an antenna has an embedded section 156 embedded in a molded portion 112 of the housing 110 and a projecting section 154 projecting from the molded portion 112.

In addition, the pin 150 is press-fit-machined. That is, a hole 152 is formed in the projecting section 154. Accordingly, when the projecting section 154 is press-inserted into the hole 180 of the board 170, a mechanical contact load is generated between the projecting section 154 and the hole 180 due to an elastic force of the projecting section 154, thereby electrically connecting the projecting section 154 to the hole 18. The pins 140, 142, 144, 146, and 160 are also press-fit-machined.

In addition, as shown in FIG. 7, the embedded section 156 of the pin 150 includes an extending section 157 extending in the embedding direction of the pin 150 and a pair of overhanging sections 158 overhanging from the extending section 157 in a direction (orthogonal direction in the example) intersecting the embedding direction of the pin 150. In addition, the radio communication module 100 is installed in the vehicle so that the projecting section 154 of the pin 150 is disposed close to the vehicle and the embedded section 156 of the pin 150 is disposed away from the vehicle.

According to the embodiment, it is possible to obtain the good performance of radio communication between the electronic device 400 and the ECUs of the vehicle and meet various types of regulations (for example, making the intensity of a transmitted radio wave smaller than a predetermined value) about radio communication.

That is, an antenna only for receiving signals only needs to meet the minimum antenna performance for receiving signals, but an antenna for transmitting and receiving signals in the embodiment needs to meet various types of regulations (for example, making the intensity of a transmitted radio wave smaller than a predetermined value) about radio communication. In this case, generally, a pattern antenna may be provided on the board 170 or a chip antenna may be mounted on the board 170 to obtain good radio communication performance and meet various types of regulations.

However, if a pattern antenna is provided on the board 170, the size of the board is increased, possibly enlarging the radio communication module 100. Alternatively, a chip antenna may be mounted on the board 170 to reduce the size of the board 170 than in a pattern antenna. However, in this case, an increase in the number of components makes the structure complicated, thereby leading to an increase in the cost.

In contrast, according to the embodiment, the pin 150 for fixing the board 170 functions as an antenna. Specifically, the pin 150 includes not only the projecting section 154 for fixing the board 170, but also the embedded section 156 embedded in the molded portion 112. Since the embedded section 156 has the extending section 157 extending away from the vehicle, a desired antenna length can be obtained by adjusting the length or the like of the extending section 157 as appropriate. In addition, since the embedded section 156 has the pair of overhanging sections 158 overhanging from the extending section 157 in a direction (orthogonal direction in the example) intersecting the embedding direction of the pin 150, the length or the like of the overhanging section 158 can be adjusted as appropriate to obtain desired antenna performance. As described above, if the pin 150 functions as an antenna, good radio communication performance can be obtained and various types of regulations can be met. As a result, there is no need to provide a pattern antenna on the board 170 or mount a chip antenna on the board 170 in the embodiment, so the size of the radio communication module 100 installed in the vehicle can be reduced by simplifying the structure thereof.

What is claimed is:

1. A radio communication module installed in a vehicle, comprising:
    a board on which electronic components for radio communication are mounted; and
    a housing accommodating the board,
    wherein the board has a hole into which a pin standing in the housing is inserted to the board in the housing, and
    wherein the pin fixes the board to the housing and functions as an antenna for transmitting and receiving a signal in the radio communication.

2. The radio communication module according to claim 1, wherein the pin functioning as the antenna includes an embedded section embedded in a molded portion of the housing and a projecting section projecting from the molded portion, and
    wherein the embedded section includes an extending section extending in a direction in which the pin is embedded and a pair of overhanging sections overhanging from the extending section in a direction intersecting the direction in which the pin is embedded.

3. The radio communication module according to claim 2, wherein the projecting section is press-fit-machined.

4. The radio communication module according to claim 2, wherein the radio communication module is installed in the vehicle so that the projecting section of the pin functioning as the antenna is disposed close to the vehicle and the embedded section of the pin functioning as the antenna is disposed away from the vehicle.

5. The radio communication module according to claim 2, wherein the board has a plurality of holes into which a plurality of pins standing in the housing are inserted to fix the board in the housing, and
    wherein at least one of the plurality of pins functions as an antenna for transmitting and receiving a signal in the radio communication.

6. The radio communication module according to claim 3, wherein the radio communication module is installed in the vehicle so that the projecting section of the pin functioning as the antenna is disposed close to the vehicle and the embedded section of the pin functioning as the antenna is disposed away from the vehicle.

7. The radio communication module according to claim 6,
wherein the board has a plurality of holes into which a plurality of pins standing in the housing are inserted to fix the board in the housing, and
wherein at least one of the plurality of pins functions as an antenna for transmitting and receiving a signal in the radio communication.

8. A radio communication module installed in a vehicle comprising:
a board on which electronic components for radio communication are mounted; and
a housing accommodating the board,
wherein the board has a hole into which a pin standing in the housing is inserted to the board in the housing,
wherein the pin functions as an antenna for transmitting and receiving a signal in the radio communication,
wherein the pin functioning as the antenna includes an embedded section embedded in a molded portion of the housing and a projecting section projecting from the molded portion, and
wherein the embedded section includes an extending section extending in a direction in which the pin is embedded and a pair of overhanging sections overhanging from the extending section in a direction intersecting the direction in which the pin is embedded.

9. The radio communication module according to claim 8, wherein the projecting section is press-fit-machined.

10. The radio communication module according to claim 8, wherein the radio communication module is installed in the vehicle so that the projecting section of the pin functioning as the antenna is disposed close to the vehicle and the embedded section of the pin functioning as the antenna is disposed away from the vehicle.

11. The radio communication module according to claim 8,
wherein the board has a plurality of holes into which a plurality of pins standing in the housing are inserted to fix the board in the housing, and
wherein at least one of the plurality of pins functions as an antenna for transmitting and receiving a signal in the radio communication.

12. The radio communication module according to claim 9,
wherein the radio communication module is installed in the vehicle so that the projecting section of the pin functioning as the antenna is disposed close to the vehicle and the embedded section of the pin functioning as the antenna is disposed away from the vehicle.

13. The radio communication module according to claim 12,
wherein the board has a plurality of holes into which a plurality of pins standing in the housing are inserted to fix the board in the housing, and
wherein at least one of the plurality of pins functions as an antenna for transmitting and receiving a signal in the radio communication.

* * * * *